United States Patent
Hanawa et al.

(10) Patent No.: US 7,935,980 B2
(45) Date of Patent: May 3, 2011

(54) METHOD OF MANUFACTURING A SEMICONDUCTOR LIGHT-EMITTING DEVICE

(75) Inventors: Kenzo Hanawa, Ichihara (JP); Yasunori Yokoyama, Ichihara (JP)

(73) Assignee: Showa Denko K.K., Tokyo (JP)

( * ) Notice: Subject to any disclaimer, the term of this patent is extended or adjusted under 35 U.S.C. 154(b) by 335 days.

(21) Appl. No.: 12/296,806

(22) PCT Filed: Apr. 13, 2007

(86) PCT No.: PCT/JP2007/058173
§ 371 (c)(1),
(2), (4) Date: Oct. 10, 2008

(87) PCT Pub. No.: WO2007/119822
PCT Pub. Date: Oct. 25, 2007

(65) Prior Publication Data
US 2009/0173962 A1    Jul. 9, 2009

(30) Foreign Application Priority Data
Apr. 13, 2006    (JP) .................................. 2006-110830

(51) Int. Cl.
*H01L 33/00*    (2010.01)
(52) U.S. Cl. .............. 257/99; 257/13; 257/79; 257/749; 257/E21.324
(58) Field of Classification Search .................... 257/13, 257/79–99, 749
See application file for complete search history.

(56) References Cited

U.S. PATENT DOCUMENTS

| | | | |
|---|---|---|---|
| 5,563,422 A | 10/1996 | Nakamura et al. |
| 5,652,434 A | 7/1997 | Nakamura et al. |
| 5,767,581 A | 6/1998 | Nakamura et al. |
| 5,877,558 A | 3/1999 | Nakamura et al. |
| 6,093,965 A | 7/2000 | Nakamura et al. |
| 6,204,512 B1 | 3/2001 | Nakamura et al. |
| 2004/0229390 A1 | 11/2004 | Seo |
| 2006/0073692 A1 | 4/2006 | Yoshida et al. |

FOREIGN PATENT DOCUMENTS

| | | |
|---|---|---|
| CN | 1529344 A | 9/2004 |
| JP | 07-094782 A | 4/1995 |
| JP | 2004-274061 A | 9/2004 |
| JP | 2005-123489 A | 5/2005 |
| JP | 2005-209734 A | 8/2005 |
| JP | 2005-317823 A | 11/2005 |
| JP | 2005-340860 A | 12/2005 |

*Primary Examiner* — Dung A. Le
(74) *Attorney, Agent, or Firm* — Sughrue Mion, PLLC

(57) ABSTRACT

A semiconductor light-emitting device having a high light emission property and preventing an electrode from being peeled off during wire bonding. Also disclosed is a method of manufacturing a semiconductor light-emitting device 1 in which an n-type semiconductor layer (13), a light-emitting layer (14), and a p-type semiconductor layer (15) are formed on a substrate (11), a transparent positive electrode (16) is formed on the p-type semiconductor layer (15), a positive electrode bonding pad (17) is formed on the transparent positive electrode (16), and a negative electrode bonding pad (18) is formed on the n-type semiconductor layer (13).

10 Claims, 2 Drawing Sheets

US 7,935,980 B2

METHOD OF MANUFACTURING A SEMICONDUCTOR LIGHT-EMITTING DEVICE

TECHNICAL FIELD

The present invention relates to a gallium nitride compound semiconductor light-emitting device and a method of manufacturing the same, and more particularly, to a technique capable of reducing the connection resistance of an electrode.

Priority is claimed on Japanese Patent Application No. 2006-110830, filed Apr. 13, 2006, the content of which is incorporated herein by reference.

BACKGROUND ART

As an example of a compound semiconductor light-emitting device, a structure has been proposed in which an n-type gallium nitride compound semiconductor layer and a p-type gallium nitride compound semiconductor layer are formed on a substrate. In recent years, gallium nitride (GaN) compound semiconductor light-emitting devices have drawn attention as short wavelength light-emitting devices. The gallium nitride compound semiconductor light-emitting device is formed by laminating an n-type or p-type semiconductor layer and a light-emitting layer on various kinds of substrates, such as a sapphire single crystal substrate, an oxide substrate, and a group III-V compound substrate, by a metal organic chemical vapor deposition (MOCVD) method or a molecular beam epitaxy (MBE) method.

The gallium nitride compound semiconductor light-emitting device is characterized in that, in order to improve emission efficiency, a transparent electrode is used such that light emitted from a light-emitting layer immediately below the electrode is not shielded by the electrode, which makes it possible to effectively emit light from the light-emitting device to the outside.

In the related art, a transparent positive electrode composed of the transparent electrode has a laminated structure of, for example, a Ni or Co oxide layer and an Au contact metal layer. In addition, in recent years, a technique has been proposed which uses as a positive electrode a laminated structure of a layer formed of a transparent conductive oxide material, such as ITO ($In_2O_3$—$SnO_2$) and a contact metal layer having a very small thickness, thereby improving transmittance and the emission efficiency of light from a light-emitting layer to the outside.

However, when a transparent electrode formed of a transparent conductive oxide material, such as ITO, is formed on a p-type gallium nitride compound semiconductor layer and a bonding pad for connection to an external electric apparatus is formed on the transparent electrode, it is difficult to obtain a good ohmic contact and strong bonding strength between the transparent electrode and the p-type semiconductor layer, and it is difficult to sufficiently reduce the contact resistance of an interface. As a result, the driving voltage Vf (standard forward voltage) of the semiconductor light-emitting device is increased, and the brightness of light is lowered. In addition, the transparent electrode is likely to be peeled off from the p-type semiconductor layer during wire bonding due to a load applied to the bonding pad.

In order to solve the problems, a semiconductor light-emitting device 108 having the structure shown in FIG. 4 has been proposed in which an n-type semiconductor layer 101 is formed on a sapphire substrate 100, a p-type semiconductor layer 103 and an electrode pad 104 are partially formed on the semiconductor layer 101, a transparent electrode 105 made of ITO (indium tin oxide) is formed on the p-type semiconductor layer 103, a contact hole 106 is formed in a portion of the transparent electrode 105, and a bonding pad 107 is directly connected to the p-type semiconductor layer 103 through the contact hole 106 (see Patent Document 1).

As such, when the bonding pad 107 is directly connected to the p-type semiconductor layer 103, the bonding strength of the bonding pad 107 to the p-type semiconductor layer 103 is stronger than that to the transparent electrode 105. Therefore, even when the bonding pad 107 is pulled by a wire during wire bonding, the bonding pad 107 is not peeled off.

[Patent Document 1] JP-A-7-94782

DISCLOSURE OF THE INVENTION

Problem that the Invention is to Solve

In the semiconductor light-emitting device 108 having the structure shown in FIG. 4, the bonding pad 107 may come into ohmic contact with the p-type semiconductor layer 103. However, since the transparent electrode 105 comes into ohmic contact with the p-type semiconductor layer, the bonding pad 107 does not need to come into ohmic contact with the p-type semiconductor layer. Therefore, the bonding pad 107 may be formed of any material as long as it can be electrically connected to the transparent electrode 105 and firmly fixed to the p-type semiconductor layer 103.

However, when the contact hole 106 is formed in the transparent electrode 105, it prevents a current from being spread into the entire surface of the transparent electrode 105, which results in a reduction in brightness and an increase in standard forward voltage Vf.

In the structure shown in FIG. 4, as described in Examples of Patent Document 1, the yield is not more than 98%. It is considered that it is preferable to reduce the possibility of the bonding pad being peeled off to a ppm order when this type of semiconductor light-emitting device is mass-produced.

Further, in the structure shown in FIG. 4, it is indispensable to form the contact hole 106 passing through a portion of the transparent electrode 105 and a photolithography process of forming the contact hole 106 in the transparent electrode 105 is additionally needed. As a result, the number of processes increases, and the p-type semiconductor layer provided immediately below the contact hole may be damaged by etching performed during the photolithography process.

Even though the bonding pad 107 is directly connected to the p-type semiconductor layer 103, contact resistance showing an ideal ohmic contact property is not necessarily obtained. Therefore, it is preferable to further reduce the contact resistance or the standard forward voltage Vf.

The present invention has been made in order to solve the above problems, and an object of the present invention is to provide a semiconductor light-emitting device capable of improving light emission efficiency to increase brightness and preventing an electrode from being peeled off during wire bonding.

Another object of the present invention is to provide a technique capable of achieving a semiconductor light-emitting device having a general structure in which an electrode made of a transparent conductive oxide material is formed on a p-type semiconductor layer and a bonding pad is formed on the electrode, thereby reducing the sheet resistance of the transparent positive electrode and decreasing a standard forward voltage, without using a structure in which a contact hole is formed in a transparent electrode made of a transparent conductive oxide material, such as ITO, and a bonding pad is directly connected to a p-type semiconductor layer.

Means for Solving the Problems

In order to achieve the above objects, the present invention adopts the following structure.

According to a first aspect of the present invention, there is provided a method of manufacturing a semiconductor light-emitting device in which an n-type semiconductor layer, a light-emitting layer, and a p-type semiconductor layer are formed on a substrate, a transparent positive electrode is formed on the p-type semiconductor layer, a positive electrode bonding pad is formed on the transparent positive electrode, and a negative electrode bonding pad is formed on the n-type semiconductor layer. The method includes: forming, on the p-type semiconductor layer, the transparent positive electrode made of a transparent conductive oxide material having an oxygen concentration that is lower than a stoichiometric composition; performing an annealing process on the transparent positive electrode in an atmosphere including oxygen; and performing a reannealing process on the transparent positive electrode in an oxygen-free atmosphere.

According to a second aspect of the present invention, in the method of manufacturing a semiconductor light-emitting device according to the above-mentioned aspect, preferably, the oxygen concentration is 0.01 at % to 10 at % lower than the stoichiometric composition.

According to a third aspect of the present invention, in the method of manufacturing a semiconductor light-emitting device according to the above-mentioned aspect, preferably, the semiconductor layer is composed of a gallium nitride compound semiconductor.

According to a fourth aspect of the present invention, in the method of manufacturing a semiconductor light-emitting device according to the above-mentioned aspect, preferably, the transmittance of the transparent positive electrode before the annealing process is in the range of 80% to 90%, the transmittance of the transparent positive electrode is improved by the annealing process, and the reannealing process is performed on the transparent positive electrode in the oxygen-free atmosphere.

According to a fifth aspect of the present invention, in the method of manufacturing a semiconductor light-emitting device according to the above-mentioned aspect, preferably, the sheet resistance of the transparent positive electrode is reduced by the reannealing process.

According to a sixth aspect of the present invention, in the method of manufacturing a semiconductor light-emitting device according to the above-mentioned aspect, preferably, the transparent positive electrode is formed on substantially the entire upper surface of the p-type semiconductor layer.

According to a seventh aspect of the present invention, in the method of manufacturing a semiconductor light-emitting device according to the above-mentioned aspect, preferably, the annealing process is performed at a temperature in the range of 250° C. to 600° C.

According to an eighth aspect of the present invention, in the method of manufacturing a semiconductor light-emitting device according to the above-mentioned aspect, preferably, the reannealing process is performed in a $N_2$ gas atmosphere at a temperature in the range of 200° C. to 500° C.

According to a ninth aspect of the present invention, in the method of manufacturing a semiconductor light-emitting device according to the above-mentioned aspect, preferably, the annealing process and the reannealing process are performed on the transparent positive electrode having an oxygen concentration that is lower than the stoichiometric composition to reduce the sheet resistance of the transparent positive electrode to 20 Ω/□ or less.

According to a tenth aspect of the present invention, in the method of manufacturing a semiconductor light-emitting device according to the above-mentioned aspect, preferably, the transparent conductive oxide material forming the transparent positive electrode is selected from at least one of ITO ($In_2O_3$—$SnO_2$), AZnO (ZnO—$Al_2O_3$), IZnO ($In_2O_3$—ZnO), and GZO (ZnO—$Ga_2O_3$).

According to an eleventh aspect of the present invention, a semiconductor light-emitting device is manufactured by the method according to any one of the first to tenth aspects.

According to a twelfth aspect of the present invention, a lamp includes the semiconductor light-emitting device according to the eleventh aspect.

According to a thirteenth aspect of the present invention, a gallium nitride compound semiconductor light-emitting device includes: a substrate; an n-type semiconductor layer, a light-emitting layer, and a p-type semiconductor layer that are composed of gallium nitride compound semiconductors and formed on the substrate; a transparent positive electrode that is formed on the p-type semiconductor layer; a positive electrode bonding pad that is formed on the transparent positive electrode; and a negative electrode bonding pad that is formed on the n-type semiconductor layer. The sheet resistance of the transparent positive electrode is less than or equal to 20 Ω/□.

According to a fourteenth aspect of the present invention, in the gallium nitride compound semiconductor light-emitting device according to the above-mentioned aspect, preferably, the sheet resistance of the transparent positive electrode is reduced to 20 Ω/□ or less by an initial annealing process that is performed on the transparent positive electrode, which is laminated on the p-type semiconductor layer and is formed of a transparent conductive oxide material having an oxygen concentration that is lower than a stoichiometric composition, in an atmosphere including oxygen, and a reannealing process that is performed on the transparent positive electrode in an oxygen-free atmosphere.

According to a fifteenth aspect of the present invention, a lamp includes the gallium nitride compound semiconductor light-emitting device according to the thirteenth or fourteenth aspect.

Advantages of the Invention

According to a method of manufacturing a semiconductor light-emitting device of the present invention, an annealing process is performed on a transparent positive electrode, which is laminated on a p-type semiconductor layer and is formed of a transparent conductive oxide material having an oxygen concentration that is lower than a stoichiometric composition, in an atmosphere including oxygen, and a reannealing process is performed on the transparent positive electrode in an oxygen-free atmosphere, thereby obtaining the transparent positive electrode having high translucency, low sheet resistance, a low standard forward voltage Vf, and strong bonding strength to the p-type semiconductor layer. Therefore, a semiconductor light-emitting device fabricated by the manufacturing method according to the present invention can improve brightness, reduce the standard forward voltage Vf, and increase the bonding strength of the transparent positive electrode.

Further, according to a semiconductor light-emitting device of the present invention, a p-type semiconductor layer side is a light observer side, a transparent positive electrode formed on the p-type semiconductor layer is made of a transparent conductive oxide material, the transparent positive electrode is formed on substantially the entire upper surface of the p-type semiconductor layer, and a bonding pad is formed only on a portion of the transparent positive electrode. In this way, a current can uniformly flow from the transparent positive electrode having low sheet resistance to substantially the entire surface of the p-type semiconductor layer, and it is possible to emit a sufficient amount of light to the outside using the transmittance of the transparent positive electrode. In addition, it is possible to increase the bonding strength between the transparent positive electrode and the p-type semiconductor layer to be stronger than the bonding strength between the bonding pad and the p-type semiconductor layer. Therefore, it is possible to prevent the bonding pad from being peeled off during wire bonding, and thus minimize the possibility of the bonding pad being peeled off during mass production. As a result, it is possible to manufacture a semiconductor light-emitting device having high reliability.

BEST MODE FOR CARRYING OUT THE INVENTION

Hereinafter, exemplary embodiments of the present invention will be described, but the present invention is not limited to the following embodiments.

Figure 1:
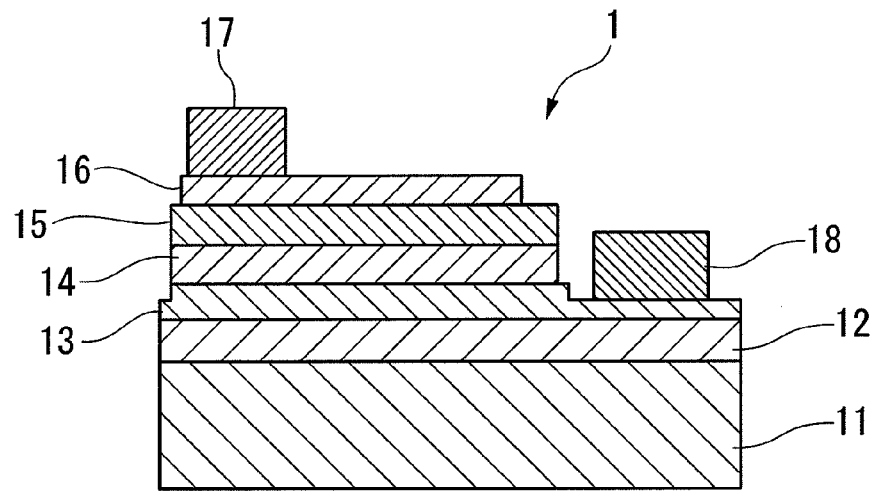
FIG. 1 is a cross-sectional view illustrating an example of a gallium nitride compound semiconductor light-emitting device according to the present invention.
Figure 2:
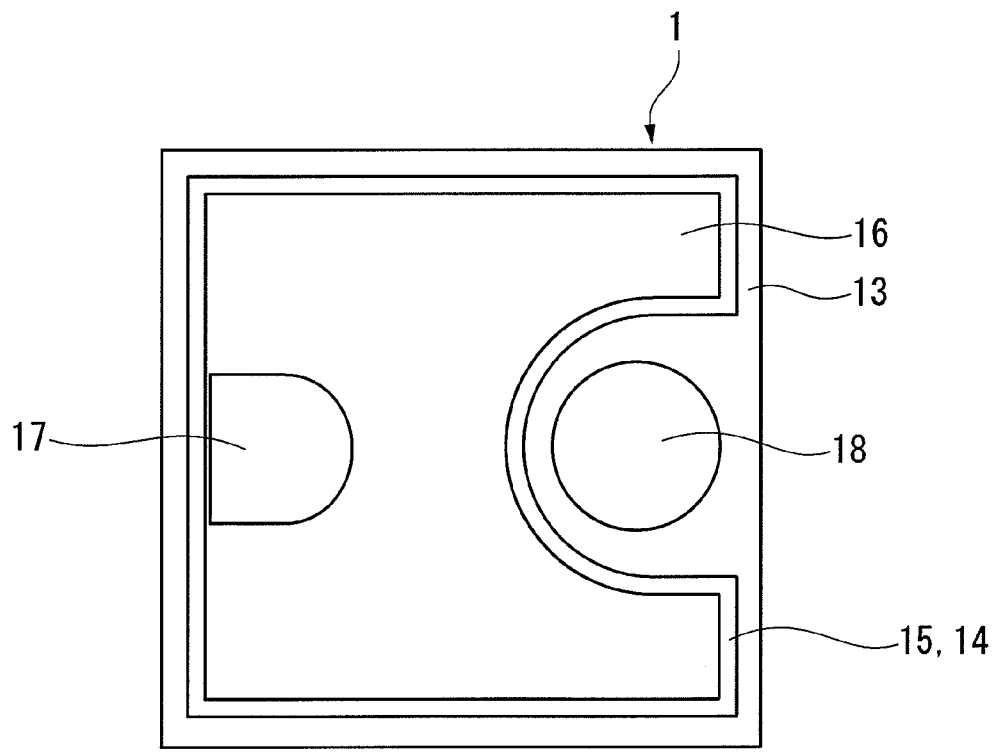
FIG. 2 is a plan view illustrating an example of the gallium nitride compound semiconductor light-emitting device.

FIGS. 1 and 2 are diagrams illustrating a gallium nitride compound semiconductor light-emitting device according to a first embodiment of the present invention.

A gallium nitride compound semiconductor light-emitting device 1 according to the first embodiment shown in FIGS. 1 and 2 has a structure in which an n-type semiconductor layer 13, a light-emitting layer 14, and a p-type semiconductor layer 15, each composed of a gallium nitride compound semiconductor, are laminated on a substrate 11 in this order with a buffer layer 12 interposed therebetween to form a double hetero structure, a transparent positive electrode 16 is formed on substantially the entire upper surface of the p-type semiconductor layer 15, a positive electrode bonding pad 17 is formed on a portion of the transparent positive electrode 16, and a negative electrode bonding pad 18 is formed on a portion of the n-type semiconductor layer 13.

The substrate 11 may be formed of any known substrate materials including oxide single crystals, such as sapphire single crystal ($Al_2O_3$; an A-plane, a C-plane, an M-plane, or an R-plane), spinel single crystal ($MgAl_2O_4$), ZnO single crystal, $LiAlO_2$ single crystal, $LiGaO_2$ single crystal, or MgO single crystal, Si single crystal, SiC single crystal, GaAs single crystal, AlN single crystal, GaN single crystal, or boride single crystal, such as $ZrB_2$. A known substrate used for the semiconductor light-emitting device may be formed of any known substrate materials without any restrictions. Among the substrate materials, the sapphire single crystal and the SiC single crystal are preferably used. In addition, the plane direction of the substrate 11 is not particularly limited. As the substrate, a just substrate or an off-angle substrate may be used.

In this embodiment, the n-type semiconductor layer 13, the light-emitting layer 14, and the p-type semiconductor layer 15, each composed of a gallium nitride compound semiconductor, are formed on the substrate 11 with the buffer layer 12 interposed therebetween. The buffer layer 12 may not be provided according to the growth conditions of the substrate 11 or an epitaxial layer, which is a semiconductor layer, during a film forming process.

Various kinds of gallium nitride compound semiconductors have been known which are represented by the general formula $Al_X Ga_Y In_Z N_{1-A} M_A$ ($0 \leq X < 1$, $0 \leq Y \leq 1$, $0 \leq Z \leq 1$, and $X+Y+Z=1$. Character M indicates a V-group element different from nitrogen (N) and $0 \leq A < 1$). The present invention can also use any kind of gallium nitride compound semiconductor represented by the general formula $Al_X Ga_Y In_Z N_{1-A} M_A$ ($0 \leq X < 1$, $0 \leq Y \leq 1$, $0 \leq Z \leq 1$, and $X+Y+Z=1$. Character M indicates a V-group element different from nitrogen N and $0 \leq A < 1$) in addition to the known gallium nitride compound semiconductors.

The gallium nitride compound semiconductor may include group-III elements other than Al, Ga, and In, and it may include elements, such as Ge, Si, Mg, Ca, Zn, Be, P, As, and B, if necessary. In addition, it may include dopants, a raw material, and a very small amount of dopant contained in a reaction coil material that are necessarily contained depending on deposition conditions, in addition to the elements that are intentionally added.

A method of growing the gallium nitride compound semiconductor is not particularly limited. For example, any method of growing a nitride compound semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, such as germane ($GeH_4$), tetramethylgermanium (($CH_3)_4Ge$), and tetraethylgermanium (($C_2H_5)_4Ge$), are used as n-type dopants. In the MBE method, elemental germanium may be used as a dopant source. Mg-based materials, such as bis-cyclopentadienylmagnesium ($Cp_2Mg$) and bisethylcyclopentadienyl magnesium ($EtCp_2Mg$), are used as p-type dopants.

In general, the n-type semiconductor layer 13 includes an underlying layer, an n contact layer, and an n clad layer. The n contact layer may also serve as the underlying layer and/or the n clad layer.

It is preferable that the underlying layer be composed of an $Al_X Ga_{1-X} N$ layer ($0 \leq x \leq 1$, preferably, $0 \leq x \leq 0.5$, more preferably, $0 \leq x \leq 0.1$). The thickness of the underlying layer is preferably greater than or equal to 0.1 µm, more preferably, greater than or equal to 0.5 µm, most preferably, greater than or equal to 1 µm. This thickness range makes it possible to obtain an $Al_X Ga_{1-X} N$ layer having high crystallinity.

The underlying layer may be doped with n-type dopants in the range of $1\times10^{17}$ to $1\times10^{19}/cm^3$. It is more preferable that the underlying layer be undoped ($<1\times10^{17}/cm^3$) in order to maintain high crystallinity. For example, the n-type dopants may be Si, Ge, and Sn, preferably, Si and Ge, but are not limited thereto.

The underlying layer is preferably grown at a temperature in the range of 800 to 1200° C., more preferably, 1000 to 1200° C. The temperature range makes it possible to obtain an underlying layer having high crystallinity. In addition, the internal pressure of an MOCVD growth furnace is preferably in the range of 15 to 40 kPa.

Similar to the underlying layer, it is preferable that the n contact layer be composed of an $Al_xGa_{1-x}N$ layer ($0 \leq x \leq 1$, preferably, $0 \leq x \leq 0.5$, more preferably, $0 \leq x \leq 0.1$). In addition, the n contact layer is preferably doped with n-type dopants. When the n-type dopants are contained at a concentration of $1\times10^{17}$ to $1\times10^{19}/cm^3$, preferably, $1\times10^{18}$ to $1\times10^{19}/cm^3$, it is possible to maintain low ohmic contact resistance with the negative electrode, prevent the occurrence of cracks, and maintain high crystallinity. For example, the n-type dopants may be Si, Ge, and Sn, preferably, Si and Ge, but are not limited thereto. The growth temperature of the n contact layer is equal to that of the underlying layer.

It is preferable that the gallium nitride compound semiconductors forming the underlying layer and the n contact layer have the same composition. The sum of the thicknesses of the semiconductor layers is preferably in the range of 1 to 20 µm, more preferably, 2 to 15 µm, most preferably, 3 to 12 µm. This thickness range makes it possible to maintain high crystallinity of the semiconductor.

It is preferable that an n clad layer be provided between the n contact layer and the light-emitting layer 14.

The n clad layer can improve the flatness of the outermost surface of the n contact layer. The n clad layer may be formed of, for example, AlGaN, GaN, or GaInN. In addition, the n clad layer may have a heterojunction structure of the semiconductor layers or a superlattice structure of a plurality of laminates of the semiconductor layers. When the n clad layer is formed of GaInN, it is preferable that the band gap thereof be larger than that of GaInN forming the light-emitting layer.

The growth temperature of an $Al_cGa_{1-c}N$ barrier layer is preferably greater than or equal to 700° C. The growth temperature of the $Al_cGa_{1-c}N$ barrier layer is preferably in the range of 800 to 1100° C. in order to obtain high crystallinity. The growth temperature of a GaInN well layer is preferably in the range of 600 to 900° C., more preferably, 700 to 900° C. That is, it is preferable to change the temperature between the layers in order to obtain high crystallinity in the MQW (multiple quantum well).

In general, the p-type semiconductor layer 15 includes a p clad layer and a p contact layer. However, the p contact layer may also serve as the p clad layer.

The p clad layer is not particularly limited as long as it has a composition that has band gap energy higher than that of the light-emitting layer and it can confine carriers in the light-emitting layer. It is preferable that the p clad layer be formed of $Al_dGa_{1-d}N$ ($0<d\leq0.4$, preferably, $0.1 \leq d \leq 0.3$). When the p clad layer is formed of AlGaN, it is possible to confine carriers in the light-emitting layer. The thickness of the p clad layer is not particularly limited, but is preferably in the range of 1 to 400 nm, more preferably, 5 to 100 nm. The p-type dopant concentration of the p clad layer is preferably in the range of $1\times10^{18}$ to $1\times10^{21}/cm^3$, preferably, $1\times10^{19}$ to $1\times10^{20}/cm^3$. This p-type dopant concentration range makes it possible to obtain good p-type crystal without deteriorating crystallinity.

The p contact layer is composed of a gallium nitride compound semiconductor layer containing at least $Al_eGa_{1-e}N$ ($0 \leq e<0.5$, preferably, $0 \leq e \leq 0.2$, more preferably, $0 \leq e \leq 0.1$). When the Al composition is within the above range, it is possible to maintain high crystallinity and low ohmic contact resistance with a p ohmic electrode.

When the p-type dopant concentration is in the range of $1\times10^{18}$ to $1\times10^{21}/cm^3$, it is possible to maintain low ohmic contact resistance, prevent the occurrence of cracks, and maintain high crystallinity. It is more preferable that the p-type dopant concentration be in the range of $5\times10^{19}$ to $5\times10^{20}/cm^3$.

For example, the p-type dopant may be Mg, but is not limited thereto.

The thickness of the p contact layer is not particularly limited, but is preferably in the range of 0.01 to 0.5 µm, more preferably, 0.1 to 0.2 µm. This thickness range makes it possible to improve emission power.

The transparent positive electrode 16 is formed of a transparent conductive oxide material, and contacts at least the p-type semiconductor layer 15. The positive electrode bonding pad 17 for electrical connection to, for example, a circuit board or a lead frame is provided on a portion of the transparent positive electrode 16 made of a transparent conductive oxide material.

The transparent positive electrode 16 may be formed of at least one of ITO ($In_2O_3$—$SnO_2$), AZnO (ZnO—$Al_2O_3$), IZnO ($In_2O_3$—ZnO), and GZO (ZnO—$Ga_2O_3$), and it may be directly formed on the p-type semiconductor layer 15 by a means that has been known in this technical field.

The transparent positive electrode 16 may be formed so as to cover substantially the entire upper surface of the p-type semiconductor layer 15, or it may be formed on the upper surface of the p-type semiconductor layer 15 except for the edge of the upper surface.

It is preferable that the thickness of the transparent positive electrode 16 be in the range of 100 to 1000 nm (0.1 to 1 µm). When the transparent positive electrode 16 is formed so as to cover substantially the entire upper surface of the p-type semiconductor layer 15, it is possible to apply a uniform electric field to substantially the entire surface of the p-type semiconductor layer 15 through the transparent positive electrode 16. As a result, it is possible to emit light uniformly all over the surface of the p-type semiconductor layer 15.

If the thickness of the transparent positive electrode 16 is smaller than 100 nm, the resistance of the transparent positive electrode 16 tends to increase, which is not preferable. On the other hand, if the thickness of the transparent positive electrode 16 is greater than 1000 nm, it is difficult to ensure the translucency of the positive electrode 16, which is not practical. Therefore, it is preferable that thickness of the transparent positive electrode 16 be in the range of 10 nm to 400 m in order to ensure the luminescence of the transparent positive electrode 16 and reduce the resistance thereof.

In this embodiment of the present invention, when the transparent positive electrode 16 is formed, a transparent conductive oxide film is formed in an oxygen-deficient condition in a stoichiometric composition, and an annealing process (heat treatment) and a reannealing process are performed thereon. The annealing process is performed under special conditions, which will be described in the following manufacturing method.

In the manufacturing method, for example, when ITO is used as a transparent conductive oxide material having a composition of $In_2O_3$-10% $SnO_2$, the sheet resistance thereof is adjusted to be lower than 20 Ω/□ to improve an ohmic contact property. It is possible to achieve the low sheet resistance and the high bonding strength between the film and the p-type semiconductor layer 15 at the same time. The heating conditions in this process will be described in detail in the following manufacturing method.

The positive electrode bonding pad 17 is formed on a portion of the transparent positive electrode 16. In FIGS. 1 and 2, the positive electrode bonding pad is positioned at the left end of the upper surface of the transparent positive electrode 16 in a side view in FIG. 1, and it is positioned substantially at the center of the left end of the transparent positive electrode 16 in plan view in FIG. 2. However, this layout is one of examples, but it is not limited to the positions shown in FIGS. 1 and 2.

The positive electrode bonding pad 17 may have various structures, such as a single layer structure and a multi-layer structure made of a conductive material, such as Au, Al, Ni, Cr, Ti, or Cu. However, the material and the structure of the positive electrode bonding pad is not particularly limited.

It is preferable that the thickness of the positive electrode bonding pad 17 be in the range of 100 to 1000 nm (0.1 µm to 1 µm). In addition, the bonding pad has characteristics that, as the thickness thereof increases, bondability is improved. Therefore, it is preferable that that thickness of the positive electrode bonding pad 17 be greater than or equal to 300 nm. In addition, it is preferable that the thickness of the positive electrode bonding pad be less than or equal to 500 nm in order to reduce manufacturing costs. The positive electrode bonding pad 17 may have a size that enables a general bonding apparatus to perform wire bonding. In this embodiment, the size of the positive electrode bonding pad 17 is may be one third to fifth of the width of the transparent positive electrode 16.

The negative electrode bonding pad 18 is formed so as to come into contact with the n-type semiconductor layer 13 of the gallium nitride compound semiconductor 1, which is a laminate of the n-type semiconductor layer 13, the light-emitting layer 14, and the p-type semiconductor layer 15 sequentially formed on the substrate 11.

Therefore, when the negative electrode bonding pad 18 is formed, the light-emitting layer 14 and the p-type semiconductor layer 15 are partially removed to expose the n contact layer of the n-type semiconductor layer 13, and the negative electrode bonding pad 18 is formed on the exposed portion.

The negative electrode bonding pad 18 may have various known structures, such as a single layer structure and a multi-layer structure made of a conductive material, such as Au, Al, Ni, Cr, Ti, or Cu. However, the material and the structure of the negative electrode bonding pad are not particularly limited, and the negative electrode bonding pad may be provided by a means that has been known in this technical field.

[Method of Manufacturing Gallium Nitride Compound Semiconductor Light-emitting Device]

A method of manufacturing the transparent positive electrode 16 provided on the p-type semiconductor layer 15 and an annealing process thereof according to the present invention will be described below in association with a method of manufacturing a gallium nitride compound semiconductor light-emitting device.

<Process of Forming Semiconductor Layer>

First, the n-type semiconductor layer 13, the light-emitting layer 14, and the p-type semiconductor layer 15 each composed of a gallium nitride compound semiconductor are sequentially formed on the substrate 11 with the buffer layer 12 interposed therebetween. The above-mentioned known materials and growth method may be used to form a laminated structure of the gallium nitride compound semiconductors, without any restrictions.

<Process of Forming Transparent Positive Electrode>

After the p-type semiconductor layer 15 is formed, the transparent positive electrode 16 made of a transparent conductive oxide material is formed on substantially the entire upper surface of the p-type semiconductor layer. The transparent positive electrode 16 is formed of a transparent conductive oxide material, such as ITO ($In_2O_3$—$SnO_2$), AZnO (ZnO—$Al_2O_3$), IZnO ($In_2O_3$—ZnO), or GZO (ZnO—$Ga_2O_3$).

It is preferable that, when the oxygen concentration is 100 at % in a stoichiometric composition, the concentration of oxygen in the transparent conductive oxide material according to the present invention be 0.01 at % to 10 at % lower than the stoichiometric composition.

Further, in the transparent conductive oxide material according to the present invention, ITO having a composition ratio of $In_2O_3$-10% $SnO_2$ may be used.

When ITO having a composition ratio of $In_2O_3$-10% $SnO_2$ is used and the deficiency of oxygen is represented by $In_2O_{3-x}$-10% $SnO_{2-y}$, it is preferable that the deficiency of oxygen satisfy $0.001<x<0.2$ and $0.001<y<0.2$. When the deficiency of oxygen is in the above-mentioned range, the transmittance of the ITO transparent positive electrode 16 is in the range of 80 to 90%. The ITO film may be formed by a deposition method using an electron beam (EB), or a sputter. When the sputter is used, $O_2$ is added by an ITO sputter under the deposition conditions of a substrate temperature of 25° C. to 300° C. and an Ar gas pressure of 0.2 to 2 Pa. However, in this embodiment, $O_2$ is not added.

When the transparent positive electrode 16 is formed of the transparent conductive oxide material by a vapor deposition method or a sputtering method, the concentration of oxygen in a deposition atmosphere is lowered to form an oxygen-deficient film. In general, during or after the deposition of a transparent conductive oxide film, such as an ITO film, an annealing process is performed on the film in an oxygen atmosphere to supply oxygen. When a sufficient amount of oxygen is supplied, the transmittance of the film is improved. However, in this embodiment, an insufficient amount of oxygen is supplied in a deposition atmosphere to form a transparent conductive oxide film in which the oxygen concentration is lower than that in a stoichiometric composition. For example, in the transparent conductive oxide film formed of ITO, when oxygen is deficient, the color of the film becomes black, and the transmittance thereof is lowered. Such a transparent conductive oxide film, for example, a transparent conductive oxide film having a transmittance of 90% or less is used.

In the film forming process, when a transparent positive electrode having a transmittance of 95% or more is formed, that is, when a transparent conductive oxide film having high transmittance is formed without a deficiency in oxygen, the resistance of the electrode is fixed to a high level, even though an annealing process is performed in an atmosphere including oxygen and a reannealing process is performed in an oxygen-free atmosphere. For example, it is difficult to reduce the sheet resistance to 50 Ω/□ or less.

After the transparent conductive oxide film having a transmittance of 90% or less is formed, an annealing process is performed on the film. In the annealing process, the film is heated in an atmosphere including oxygen at a temperature increase rate of 20° C./minute to 500° C./minute, maintained at a temperature in the range of 250° C. to 600° C. for 30 seconds to 10 minutes, and cooled down. In the heating rate range of 20° C./minute to 500° C./minute during the annealing process, it is preferable to perform the heating at a high rate in order to obtain high reproducibility.

It is preferable that the content of oxygen in the atmosphere be in the range of 0.1% to 50%. If the content of oxygen in the atmosphere is less than 0.1%, oxygen is removed from the transparent conductive oxide film, and the transmittance of the film tends to be lowered. If the content of oxygen in the atmosphere is more than 50%, the transmittance is improved, but the electric resistance of the transparent conductive oxide film is rapidly increased. If the annealing temperature is lower than 250° C., the transparent conductive oxide film is not sufficiently oxidized, and the transmittance of the film is maintained at a low level. If the annealing temperature is higher than 600° C., the p-type semiconductor layer 15 is oxidized, and light emission may not occur.

After the annealing process is performed on the transparent conductive oxide film under an oxygen deficient condition, a reannealing process is performed on the film in a $N_2$ atmosphere (in an oxygen-free atmosphere). When the reannealing process is performed after the annealing process, the atmosphere after the annealing process may be switched from an atmosphere including oxygen to an oxygen-free atmosphere (for example, a $N_2$ gas atmosphere), and then the reannealing process may be performed. Alternatively, after the annealing process, the film may be cooled down to room temperature, the atmosphere is switched to the oxygen-free atmosphere, and then the reannealing process may be performed on the film.

The second annealing process is performed in order to reduce only the electric resistance of the film without lowering the transmittance. For example, it is preferable to perform the second annealing process in a gas atmosphere including 99.9% or more of $N_2$ having a dew point of −30° C. or less. The reannealing process is performed at a temperature in the range of 200° C. to 500° C. for 1 to 20 minutes. In the heating rate range of 200° C./minute to 500° C./minute during the reannealing process, it is preferable to perform heating at a high rate.

The two-stage annealing process makes it possible to reduce the sheet resistance of the transparent positive electrode 16. Specifically, the two-stage annealing process can change the transparent conductive oxide film on the p-type semiconductor layer 13 into the transparent positive electrode 16 having low specific resistance and a good ohmic contact property. Two annealing processes in an oxygen atmosphere and an oxygen-free atmosphere can improve the density and the mechanical strength of ITO. It is possible to reduce the sheet resistance to 20 Ω/□ or less and sufficiently decrease a standard forward voltage (Vf) by a combination of these conditions.

Then, the bonding pad 17 for connecting a bonding wire is formed on a portion of the transparent positive electrode 16. In this way, it is possible to manufacture the gallium nitride compound semiconductor light-emitting device 1 having the structure shown in FIG. 1.

According to the gallium nitride compound semiconductor light-emitting device 1 having the above-mentioned structure, it is possible to ensure a good ohmic contact property, even when the bonding pad 17 is directly laminated on the transparent positive electrode 16, and it is also possible to reduce the sheet resistance of the transparent positive electrode 16. Therefore, it is possible to reliably apply an electric field from the transparent positive electrode 16 to the large area of the p-type semiconductor layer 15 through the bonding pad 17, and thus emit uniform light from the large area of the p-type semiconductor layer 15. In addition, it is possible to obtain sufficiently strong bonding between the transparent positive electrode 16 and the p-type semiconductor layer 15 since the bonding strength of an oxide is stronger than that of a nitride, and the two-stage annealing process of an annealing process in an atmosphere including oxygen and a reannealing process in an oxygen-free atmosphere makes it possible to sufficiently improve the mechanical strength of the transparent positive electrode 16. Further, since the bonding pad 17 is formed of a metallic material that is stable for an oxide, such as Cr, Al, or Ti, the bonding strength between the transparent positive electrode 16 and the bonding pad 17 can be stronger than that between the p-type semiconductor layer 15 and the transparent positive electrode 16.

In a transparent positive electrode formed of ITO by a general method which is not deficient in oxygen and has a transmittance of 95% or more, bonding strength to a p-type semiconductor layer 103 is low, and the sheet resistance of the transparent positive electrode is high, which results in an increase in the standard forward voltage Vf.

The reason is as follows. In general ITO, which is one kind of n-type semiconductor, a p-n junction is formed at the interface between the ITO film and the p-type semiconductor layer, which may causes an increase in the standard forward voltage Vf. In contrast, in the present invention, an ITO film having a transmittance of 80% to 90% and an insufficient amount of oxygen is formed, and then an annealing process and a reannealing process are performed on the ITO film to form a conductive compound or a conductive structure between the ITO film and a p-type GaN film forming the p-type semiconductor layer.

The gallium nitride compound semiconductor light-emitting device 1 according to the present invention has a low standard forward voltage Vf and high light emission efficiency. Therefore, it is possible to achieve a high-efficiency lamp.

A transparent cover may be provided to the gallium nitride compound semiconductor light-emitting device 1 according to the present invention to form a lamp by, for example, a known means. In addition, it is possible to form a white lamp by combining the gallium nitride compound semiconductor light-emitting device 1 according to the present invention with a cover including a phosphor.

Figure 3:
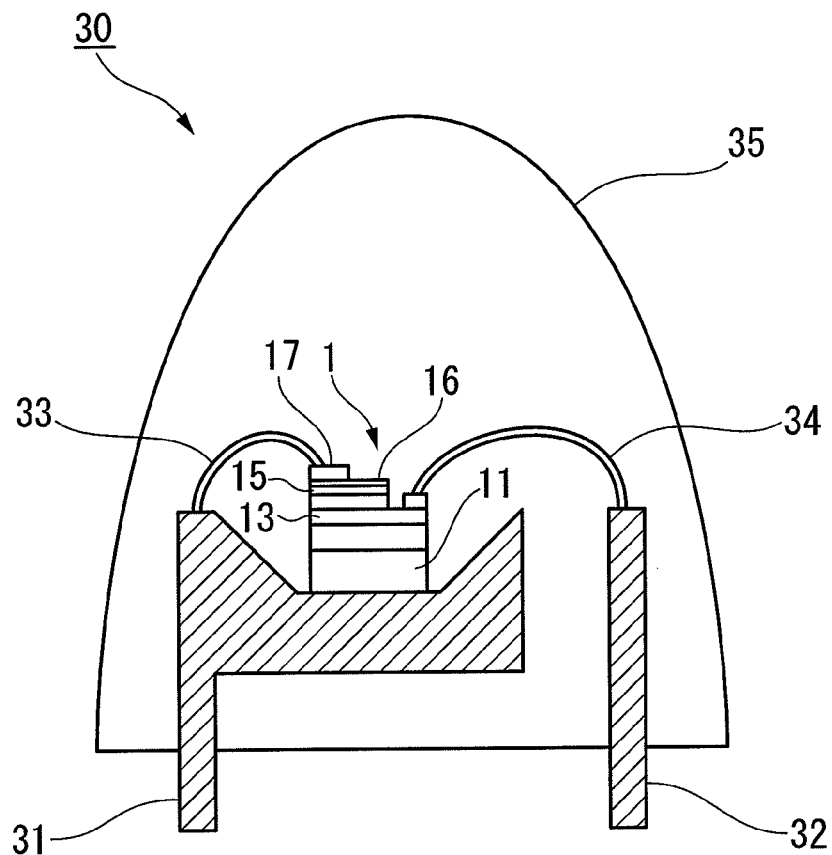
FIG. 3 is a diagram illustrating an example of a light-emitting apparatus including the gallium nitride compound semiconductor light-emitting device according to the present invention.
Figure 4:
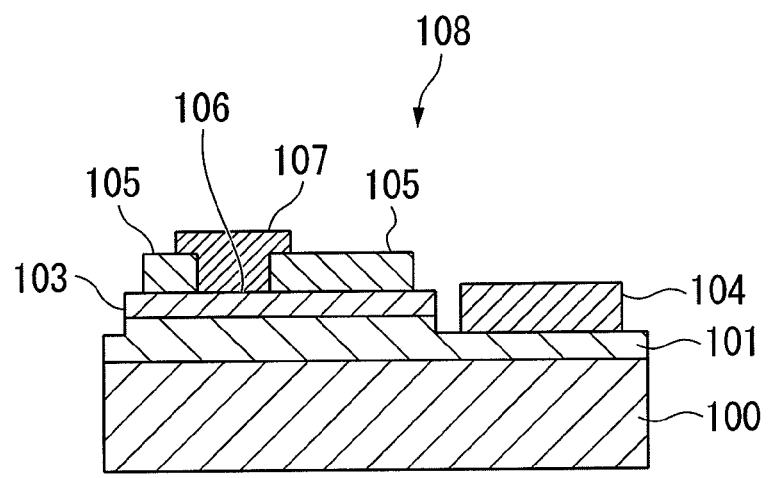
FIG. 4 is a cross-sectional view illustrating an example of a gallium nitride compound semiconductor light-emitting device according to the related art.

For example, as shown in FIG. 3, the gallium nitride compound semiconductor light-emitting device 1 according to the present invention may be used to form an LED lamp by any known method. The gallium nitride compound semiconductor light-emitting device may be used for various types of lamps, such as a general-purpose bomb-shaped lamp, a side view lamp for a backlight of a mobile phone, and a top view lamp used for a display device. For example, when a face-up gallium nitride compound semiconductor light-emitting device is mounted to the bomb-shaped lamp, as shown in FIG. 3, the gallium nitride compound semiconductor light-emitting device 1 is adhered to one of two frames 31 and 32 by, for example, resin, and the positive electrode bonding pad 17 and the negative electrode bonding pad 18 are respectively bonded to the frames 31 and 32 by wires 33 and 34 formed of, for example, gold. Then, the periphery of the device is molded by a transparent resin to form a mold 35, thereby manufacturing a bomb-shaped lamp 30.

EXAMPLES

Next, the present invention will be described in more detail with reference to Examples, but the present invention is not limited thereto.
(Manufacture of Gallium Nitride Compound Semiconductor Light-emitting Device)

A gallium nitride compound semiconductor layer was formed on a sapphire substrate 1 with a buffer layer 12 made of AlN interposed therebetween. The gallium nitride compound semiconductor layer was formed by laminating an N-type semiconductor layer 13, a light-emitting layer 14 having a multiple quantum well structure, and a p-type semiconductor layer 15 in this order. The N-type semiconductor layer 13 was formed by laminating an undoped GaN underlying layer with a thickness of 8 μm, a Ge-doped n-type GaN contact layer with a thickness of 2 μm, and an n-type $In_{0.06}Ga_{0.94}N$ clad layer with a thickness of 0.02 μm in this order. The light-emitting layer 14 having a multiple quantum structure was formed by providing a barrier layer on five laminates of a Si-doped GaN barrier layer with a thickness of 16 nm and an $In_{0.06}Ga_{0.94}N$ well layer with a thickness of 2.5 nm. The p-type semiconductor layer 15 was formed by laminating a Mg-doped p-type $Al_{0.07}Ga_{0.93}N$ clad layer with a thickness of 0.01 μm and a Mg-doped p-type $Al_{0.02}Ga_{0.98}N$ contact layer with a thickness of 0.18 μm. The semiconductor was configured such that light was emitted from the surface of the semiconductor layer.

In this structure, the carrier concentration of the n-type GaN contact layer is $1\times10^{19}$ cm$^{-3}$, and the doping amount of Si in the GaN barrier layer is $1\times10^{17}$ cm$^{-3}$. The carrier concentration of the p-type AlGaN contact layer is $5\times10^{18}$ cm$^{-3}$, and the doping amount of Mg in the AlGaN contact layer is $5\times10^{19}$ cm$^{-3}$. The laminated structure of the gallium nitride compound semiconductor layer (reference numerals 12, 13, 14, and 15 in FIG. 1) was formed by an MOCVD method.

Then, the n-type GaN contact layer in a region for forming the negative electrode was exposed from the gallium nitride compound semiconductor layer by a reactive ion etching method. In this case, first, a resist was uniformly applied on the entire surface of the p-type semiconductor layer, and the resist was removed from the region for forming the negative electrode by a known lithography technique. Then, the laminated structure was put into a vapor deposition apparatus, and Ni and Ti were deposited at a pressure of $4\times10^{-4}$ Pa or less by an electron beam method to form films with thicknesses of 50 nm and 300 nm, respectively. Thereafter, the resist and a metal film other than the region for forming the negative electrode were removed by a lift-off technique.

(Formation of Transparent Positive Electrode)

Then, a transparent positive electrode (current diffusion layer) formed of ITO having a composition ratio represented by $In_2O_{3-x}$-10% $SnO_{2-y}$, was formed on substantially the entire surface of the p-type AlGaN contact layer by the photolithography technique and the lift-off technique. In the formation of the transparent positive electrode, a substrate having the gallium nitride compound semiconductor layer formed thereon was put into a vapor deposition apparatus, and then the transparent positive electrode formed of ITO having the above-mentioned composition ratio was formed with a thickness of 1 μm on the p-type AlGaN contact layer. The transmittance immediately after the ITO film is formed is shown in Table 1. The transmittance varies in proportion to a deficiency in oxygen in the stoichiometric composition of ITO. Therefore, as the transmittance is decreased, the oxygen deficiency is increased.

Then, the samples were taken out from the vacuum chamber, and an annealing process was performed on the samples in a gas atmosphere including 20% of oxygen (80% $N_2$ atmosphere) shown in the following Table 1 at the processing temperatures and times shown in Table 1. Then, a reannealing process was performed on the samples in a $N_2$ atmosphere at the processing temperatures and times shown in Table 1 to obtain a gallium nitride compound semiconductor light-emitting device.

(Formation of Bonding Pad)

Next, the positive electrode bonding pad 17 and the negative electrode bonding pad 18 were formed as follows.

First, a first layer made of Au, a second layer made of Ti, a third layer made of Al, a fourth layer made of Ti, and a fifth layer made of Au were sequentially formed on a portion of the ITO film by a known procedure called lift-off and the same deposition method as described above, thereby forming the five-layer positive electrode bonding pad 17. The thicknesses of the Au, Ti, Al, Ti, and Au layers were 50 nm, 20 nm, 10 nm, 100 nm, and 200 nm, respectively.

Then, the negative electrode bonding pad 18 was formed on the n-type GaN contact layer exposed by the reactive ion etching method by the following processes.

First, a resist was uniformly applied on the entire surface of the exposed region of the n-type GaN contact layer, and the resist was removed from a portion for forming the negative electrode on the exposed n-type GaN contact layer by a known lithography technique. Then, Ti and Au were respectively deposited with thicknesses of 100 nm and 200 nm on the semiconductor by a general vapor deposition method, thereby forming the negative electrode bonding pad 18. Then, the resist was removed by a known method.

Then, the rear surface of the substrate 11 having the positive electrode bonding pad and the negative electrode bonding pad formed thereon was ground/polished to a thickness of 80 μm, and a laser scriber was used to mark the semiconductor. Then, the semiconductor was cut into chips each having a 350 μm square.

(Measurement of Driving Voltage Vf and Emission Power Po)

A probe contacted the chip and a current of 20 mA was applied to the chip to measure the standard forward voltage (driving voltage: Vf). The measured results are shown in Table 1.

In addition, the chip was mounted to a TO-18 package, and the emission power thereof was measured by a tester. The emission power measured when a current of 20 mA was applied was shown in Table 1.

It was found that light was emitted from the entire surface of the transparent positive electrode. In addition, the number of electrodes peeled off when wire bonding was performed on the positive electrode bonding pads among 100,000 gallium nitride compound semiconductor light-emitting devices fabricated by the same method as described above was examined. Further, the sheet resistance of the transparent positive electrode was measured by a four-terminal method.

The results are shown in Table 1.

TABLE 1

| | Window portion | Transmittance % | Annealing in atmosphere including oxygen 20% $O_2$ | Annealing in $N_2$ atmosphere 99.9% $N_2$ | Sheet resistance of ITO Ω/□ | Output when 20 mA is applied mW | Vf V | Number of electrodes peeled off during wire bonding among 100000 gallium nitride compound semiconductor light-emitting devices |
|---|---|---|---|---|---|---|---|---|
| Example 1 | Absent | 80 | 600° C.-1 min | 500° C.-1 min | 13 | 12.6 | 3.12 | 0 |
| Example 2 | Absent | | 250° C.-10 min | 500° C.-1 min | 17 | 12.1 | 3.16 | 0 |

TABLE 1-continued

| | Window portion | Transmittance % | Annealing in atmosphere including oxygen 20% O$_2$ | Annealing in N$_2$ atmosphere 99.9% N$_2$ | Sheet resistance of ITO Ω/□ | Output when 20 mA is applied mW | Vf V | Number of electrodes peeled off during wire bonding among 100000 gallium nitride compound semiconductor light-emitting devices |
|---|---|---|---|---|---|---|---|---|
| Example 3 | Absent | | 600° C.-1 min | 200° C.-20 min | 18 | 12.0 | 3.17 | 0 |
| Example 4 | Absent | | 250° C.-10 min | 200° C.-20 min | 20 | 11.9 | 3.17 | 0 |
| Example 5 | Absent | 90 | 600° C.-1 min | 500° C.-1 min | 15 | 12.1 | 3.19 | 0 |
| Example 6 | Absent | | 250° C.-10 min | 500° C.-1 min | 19 | 12.0 | 3.17 | 0 |
| Example 7 | Absent | | 600° C.-1 min | 200° C.-20 min | 18 | 12.2 | 3.18 | 0 |
| Example 8 | Absent | | 250° C.-10 min | 200° C.-20 min | 20 | 12.0 | 3.20 | 0 |
| Example 9 | Absent | 85 | 0.1% O$_2$ 600° C.-1 min | 500° C.-1 min | 17 | 12.3 | 3.14 | 0 |
| Example 10 | Absent | 85 | 600° C.-1 min | 99.999% N$_2$ 500° C.-1 min | 12 | 12.7 | 3.12 | 0 |
| Comparative example 1 | Present | 80 | 600° C.-1 min | 500° C.-1 min | 14 | 11.5 | 3.18 | 15 |
| Comparative example 2 | Present | 95 | Not executed | Not executed | 25 | 10.8 | 3.51 | 17 |
| Comparative example 3 | Absent | | 230° C.-20 min | 500° C.-1 min | 35 | 11.7 | 3.20 | 1 |
| Comparative example 4 | Absent | | 600° C.-1 min | 150° C.-20 min | 43 | 11.3 | 3.23 | 3 |
| Comparative example 5 | Absent | | 650° C.-1 min | 500° C.-1 min | 29 | 11.4 | 3.25 | 2 |
| Comparative example 6 | Absent | 95 | Not executed | Not executed | 25 | 10.8 | 3.58 | 11 |
| Comparative example 7 | Absent | 95 | 600° C.-1 min | 500° C.-1 min | 19 | 10.6 | 3.48 | 12 |
| Comparative example 8 | Absent | 80 | 600° C.-1 min | 99% N$_2$ 500° C.-1 min | 27 | 12.1 | 3.45 | 2 |
| Comparative example 9 | Absent | 80 | 60% O$_2$ 600° C.-1 min | 500° C.-1 min | 23 | 12.0 | 3.34 | 3 |
| Comparative example 10 | Absent | 80 | 0.05% O$_2$ 600° C.-1 min | 500° C.-1 min | 30 | 11.7 | 3.32 | 9 |

As can be seen from Table 1, after an ITO film having an insufficient amount of oxygen and a transmittance of 80 to 90% was formed, an annealing process was performed on the ITO film in an atmosphere including 20% of oxygen at a temperature in the range of 250° C. to 600° C. for 1 to 10 minutes, and a reannealing process was performed thereon in a N$_2$ atmosphere in the range of 200° C. to 500° C. for 1 to 20 minutes. As a result, the transparent positive electrode formed of ITO had a low sheet resistance of 12 to 20 Ω/□, the gallium nitride compound semiconductor light-emitting device had a high emission power of 11.9 to 12.7 mW, the standard forward voltage Vf was in the range of 3.12 V to 3.20 V, which was a low level, and no electrode was peeled off among 100,000 gallium nitride compound semiconductor light-emitting device. That is, a good peeling examination result capable of considering a ppm order was obtained. Although not shown in Table 1, when the annealing process was performed in an atmosphere including 20% of oxygen and 80% of N$_2$ for one or more minutes, the transparent positive electrode formed of ITO without a deficiency of oxygen had a transmittance of 97% or more in a blue wavelength range of 450 nm to 480 nm. Therefore, sufficient translucency was obtained.

In contrast, even when the annealing process and the reannealing process were performed on a sample formed of ITO having a transmittance of about 95% during a film forming process, the sheet resistance of the sample was not reduced. In the comparative example 1 in which a hole was formed in the transparent positive electrode and a bonding pad was connected to the p-type semiconductor layer, even though two annealing processes were performed, the number of bonding wires was increased. In the Comparative Example 2 in which no annealing process was performed on a sample, the sheet resistance was high and the number of electrodes peeled off was increased.

In the Comparative Examples 9 and 10 in which the transmittance was reduced to 80% and an initial annealing process was performed in an atmosphere including an excessively large amount of oxygen or an excessively small amount of oxygen, the sheet resistance of the transparent positive electrode was high.

INDUSTRIAL APPLICABILITY

The present invention can be applied to a gallium nitride compound semiconductor light-emitting device and a method of manufacturing the same, and particularly, to a technique capable of reducing the connection resistance of an electrode.

The invention claimed is:

1. A method of manufacturing a semiconductor light-emitting device in which an n-type semiconductor layer, a light-emitting layer, and a p-type semiconductor layer are formed on a substrate, a transparent positive electrode is formed on the p-type semiconductor layer, a positive electrode bonding pad is formed on the transparent positive electrode, and a negative electrode bonding pad is formed on the n-type semiconductor layer, the method comprising:
    forming, on the p-type semiconductor layer, the transparent positive electrode made of a transparent conductive oxide material having an oxygen concentration that is lower than a stoichiometric composition;
    performing an annealing process on the transparent positive electrode in an atmosphere including oxygen; and
    performing a reannealing process on the transparent positive electrode in an oxygen-free atmosphere.

2. The method of manufacturing a semiconductor light-emitting device according to claim 1,
    wherein the oxygen concentration is 0.01 at % to 10 at % lower than the stoichiometric composition.

3. The method of manufacturing a semiconductor light-emitting device according to claim 1,
wherein the semiconductor layer is composed of a gallium nitride compound semiconductor.

4. The method of manufacturing a semiconductor light-emitting device according to claim 1,
wherein the transmittance of the transparent positive electrode before the annealing process is in the range of 80% to 90%,
the transmittance of the transparent positive electrode is improved by the annealing process, and
the reannealing process is performed on the transparent positive electrode in the oxygen-free atmosphere.

5. The method of manufacturing a semiconductor light-emitting device according to claim 1,
wherein the sheet resistance of the transparent positive electrode is reduced by the reannealing process.

6. The method of manufacturing a semiconductor light-emitting device according to claim 1,
wherein the transparent positive electrode is formed on substantially the entire upper surface of the p-type semiconductor layer.

7. The method of manufacturing a semiconductor light-emitting device according to claim 1,
wherein the annealing process is performed at a temperature in the range of 250° C. to 600° C.

8. The method of manufacturing a semiconductor light-emitting device according to claim 1,
wherein the reannealing process is performed in a $N_2$ gas atmosphere at a temperature in the range of 200° C. to 500° C.

9. The method of manufacturing a semiconductor light-emitting device according to claim 1,
wherein the annealing process and the reannealing process are performed on the transparent positive electrode having an oxygen concentration that is lower than the stoichiometric composition to reduce the sheet resistance of the transparent positive electrode to 20 Ω/☐ or less.

10. The method of manufacturing a semiconductor light-emitting device according to claim 1,
wherein the transparent conductive oxide material forming the transparent positive electrode is selected from at least one of ITO ($In_2O_3$—$SnO_2$), AZnO (ZnO—$Al_2O_3$), IZnO ($In_2O_3$—ZnO), and GZO (ZnO—$Ga_2O_3$).

* * * * *